United States Patent
Tsai et al.

(10) Patent No.: US 9,748,165 B2
(45) Date of Patent: Aug. 29, 2017

(54) PACKAGING STRUCTURE

(71) Applicant: DELTA ELECTRONICS, INC., Taoyuan (TW)

(72) Inventors: Hsin-Chang Tsai, Taoyuan (TW); Peng-Hsin Lee, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 27 days.

(21) Appl. No.: 15/052,899

(22) Filed: Feb. 25, 2016

(65) Prior Publication Data

US 2016/0172281 A1 Jun. 16, 2016

Related U.S. Application Data

(63) Continuation-in-part of application No. 14/291,563, filed on May 30, 2014, now Pat. No. 9,431,327.

(51) Int. Cl.
| | |
|---|---|
| *H01L 23/495* | (2006.01) |
| *H01L 23/31* | (2006.01) |
| *H01L 25/07* | (2006.01) |
| *H01L 23/00* | (2006.01) |
| *H01L 23/433* | (2006.01) |

(52) U.S. Cl.
CPC .... *H01L 23/49541* (2013.01); *H01L 23/3114* (2013.01); *H01L 23/4334* (2013.01); *H01L 23/495* (2013.01); *H01L 23/49503* (2013.01); *H01L 23/49513* (2013.01); *H01L 23/49548* (2013.01); *H01L 23/49551* (2013.01); *H01L 23/49562* (2013.01); *H01L 23/49568* (2013.01); *H01L 23/49575* (2013.01); *H01L 24/40* (2013.01); *H01L 25/072* (2013.01); *H01L 2224/0603* (2013.01); *H01L 2224/32245* (2013.01); *H01L 2224/40245* (2013.01)

(58) Field of Classification Search
CPC ............. H01L 23/495; H01L 23/49503; H01L 23/49513; H01L 23/49541; H01L 23/49548; H01L 23/49551; H01L 23/49568; H01L 23/49575
See application file for complete search history.

(56) References Cited

U.S. PATENT DOCUMENTS

| | | | | |
|---|---|---|---|---|
| 5,255,430 | A * | 10/1993 | Tallaksen | G06K 19/07745 174/530 |
| 9,431,327 | B2 * | 8/2016 | Tsai | H01L 23/49503 |
| 2001/0054751 | A1 * | 12/2001 | Toyosawa | H01L 23/3107 257/668 |
| 2013/0121000 | A1 * | 5/2013 | Lee | H01L 33/56 362/293 |
| 2013/0127031 | A1 * | 5/2013 | Hosseini | H01L 23/13 257/676 |

(Continued)

*Primary Examiner* — Joseph C Nicely
(74) *Attorney, Agent, or Firm* — CKC & Partners Co., Ltd.

(57) ABSTRACT

A packaging structure includes a lead frame, a chip, and a packaging material. The lead frame has a pair of opposed first surface and second surface, and has a first recessed region located on the second surface. The chip has a pair of opposed first surface and second surface. The first surface of the chip is fixed on the first recessed region. The packaging material surrounds the lead frame and the chip. The second surface of the chip is exposed from the packaging material, and the first surface of the lead frame is exposed from the packaging material.

20 Claims, 8 Drawing Sheets

(56) References Cited

U.S. PATENT DOCUMENTS

| | | | |
|---|---|---|---|
| 2013/0168723 A1* | 7/2013 | Kasae | F21V 21/00 257/99 |
| 2013/0177998 A1* | 7/2013 | Hong | H01L 33/0095 438/15 |
| 2013/0241041 A1* | 9/2013 | Yu | H01L 24/97 257/676 |
| 2013/0299854 A1* | 11/2013 | Lee | H01L 33/62 257/88 |
| 2014/0340302 A1* | 11/2014 | Sengupta | G06F 3/042 345/156 |
| 2015/0115458 A1* | 4/2015 | Palm | H01L 24/31 257/774 |
| 2015/0344294 A1* | 12/2015 | Ghahremani | B81B 7/007 257/419 |
| 2016/0064310 A1* | 3/2016 | Sirinorakul | H01L 23/49541 257/676 |

* cited by examiner

PACKAGING STRUCTURE

RELATED APPLICATIONS

This application is a Continuation-in-part of U.S. application Ser. No. 14/291,563, filed on May 30, 2014, and the entirety of which is incorporated by reference herein.

BACKGROUND

Technical Field

The present disclosure relates to a packaging structure.

Description of Related Art

A lead frame is used, for example, in the fabrication of plastic molded enclosures, also referred to as a "packaging structure". The lead frame can be fabricated from a metal, for example, copper, and typically comprises a paddle which is secured to the body of the lead frame and typically situated at center of the lead frame. The lead frame also includes a number of leads which are secured to the frame. In an "exposed" paddle lead frame based molded package, the bottom of the paddle of the lead frame is left exposed in order to attach the bottom of the paddle to a printed circuit board.

To further improve various characteristics of a packaging structure, people in the industry all endeavor to search the solutions. How to provide a packaging structure with better characteristics is one of the important research topics, and is also a target that needs to be improved in the related fields.

SUMMARY

This disclosure provides a packaging structure with enhanced heat dissipating ability.

In one aspect of the disclosure, a packaging structure is provided. The packaging structure includes a lead frame, a first chip, and a packaging material. The lead frame has a pair of opposed first surface and second surface, and has a first recessed region located on the second surface. The first chip has a pair of opposed first surface and second surface. The first surface of the first chip is fixed on the first recessed region of the lead frame. The packaging material surrounds the lead frame and the first chip. The second surface of the first chip is exposed from the packaging material, and the first surface of the lead frame is exposed from the packaging material.

In one or more embodiments, the lead frame has a second recessed region located on the second surface of the lead frame. The packaging structure further includes a second chip having a pair of opposed first surface and second surface. The first surface of the second chip is fixed on the second recessed region of the lead frame. The packaging material further surrounds the second chip, and the second surface of the second chip is exposed from the packaging material.

In another aspect of the disclosure, a packaging structure is provided. The packaging structure includes a lead frame, a first chip, a heat-dissipating member, and a packaging material. The lead frame has a pair of opposed first surface and second surface, and has a first recessed region located on the second surface. The first chip has a pair of opposed first surface and second surface. The first surface of the first chip is fixed on the first recessed region of the lead frame. The heat-dissipating member has a pair of opposed first surface and second surface. The first surface of the heat-dissipating member thermally contacts the second surface of the first chip. The packaging material surrounds the lead frame, the first chip, and the heat-dissipating member. The second surface of the heat-dissipating member is exposed from the packaging material, and the first surface of the lead frame is exposed from the packaging material.

In one or more embodiments, the first surface of the lead frame is not covered by the packaging material.

In one or more embodiments, the packaging structure further includes a second recessed region located on the second surface of the lead frame. The packaging structure further includes a second chip having a pair of opposed first surface and second surface. The first surface of the second chip is fixed on the second recessed region of the lead frame. The packaging material further surrounds the second chip.

In one or more embodiments, thicknesses of the first recessed region of the lead frame and the second recessed region of the lead frame are the same substantially.

In one or more embodiments, thicknesses of the first recessed region of the lead frame and the second recessed region of the lead frame are different.

In one or more embodiments, the first recessed region is divided into a first segment and a second segment, the first segment is spatially isolated from the second segment, and the first surface of the first chip is electrically connected to the first segment and the second segment.

In one or more embodiments, the lead frame has a flat region relative to the first recessed region, and a thickness of the flat region is greater than a thickness of the first recessed region.

In one or more embodiments, a thickness of the first chip substantially equals to the thickness of the flat region of the lead frame.

In one or more embodiments, a thickness of the first chip is greater than a thickness of the first recessed region of the lead frame.

In one or more embodiments, the first surface of the lead frame is flat.

Because the first surface of the lead frame is exposed from the packaging material and the second surface of the first chip is exposed from the packaging material, and the first chip is fixed on the first recessed region of the lead frame, the heat generated by the first chip can be effectively dissipated through the first surface of the lead frame and the second surface of the first chip. Therefore, the heat dissipating ability of the packaging structure is effectively enhanced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
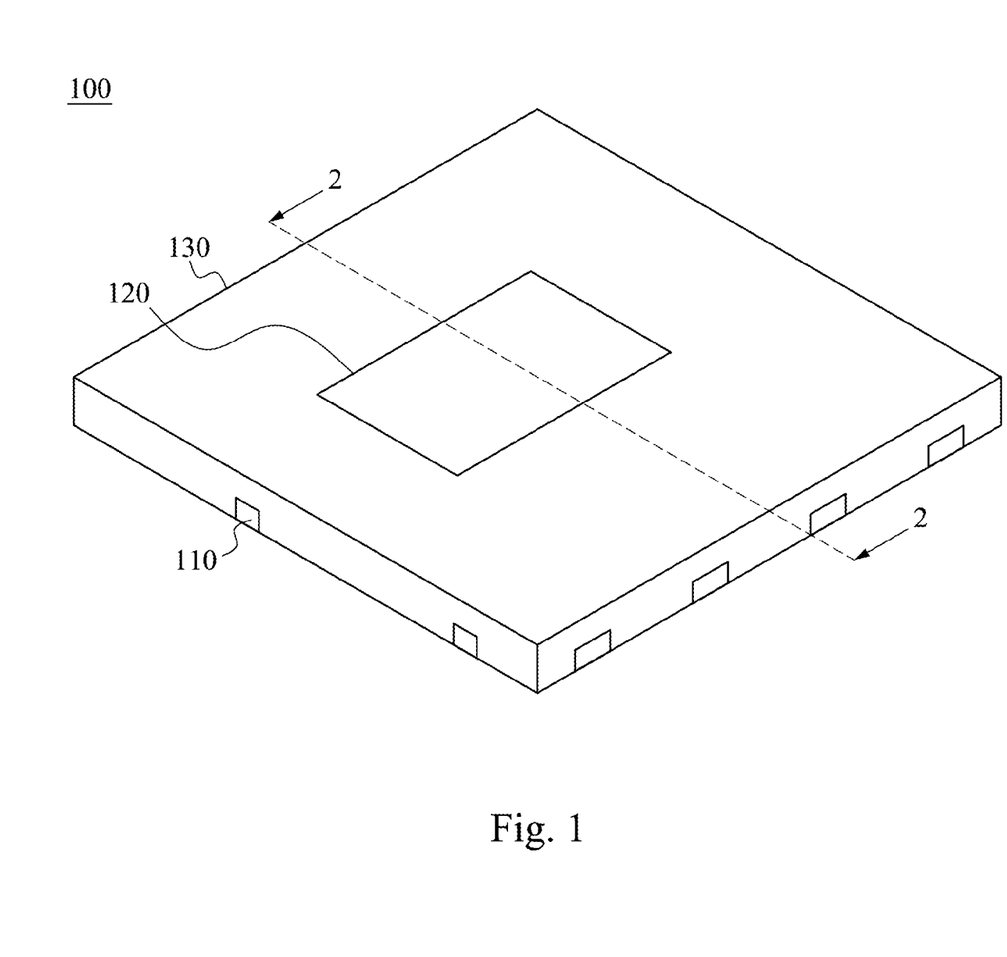
FIG. 1 is a perspective view of a packaging structure according to one embodiment of this invention.
Figure 2:
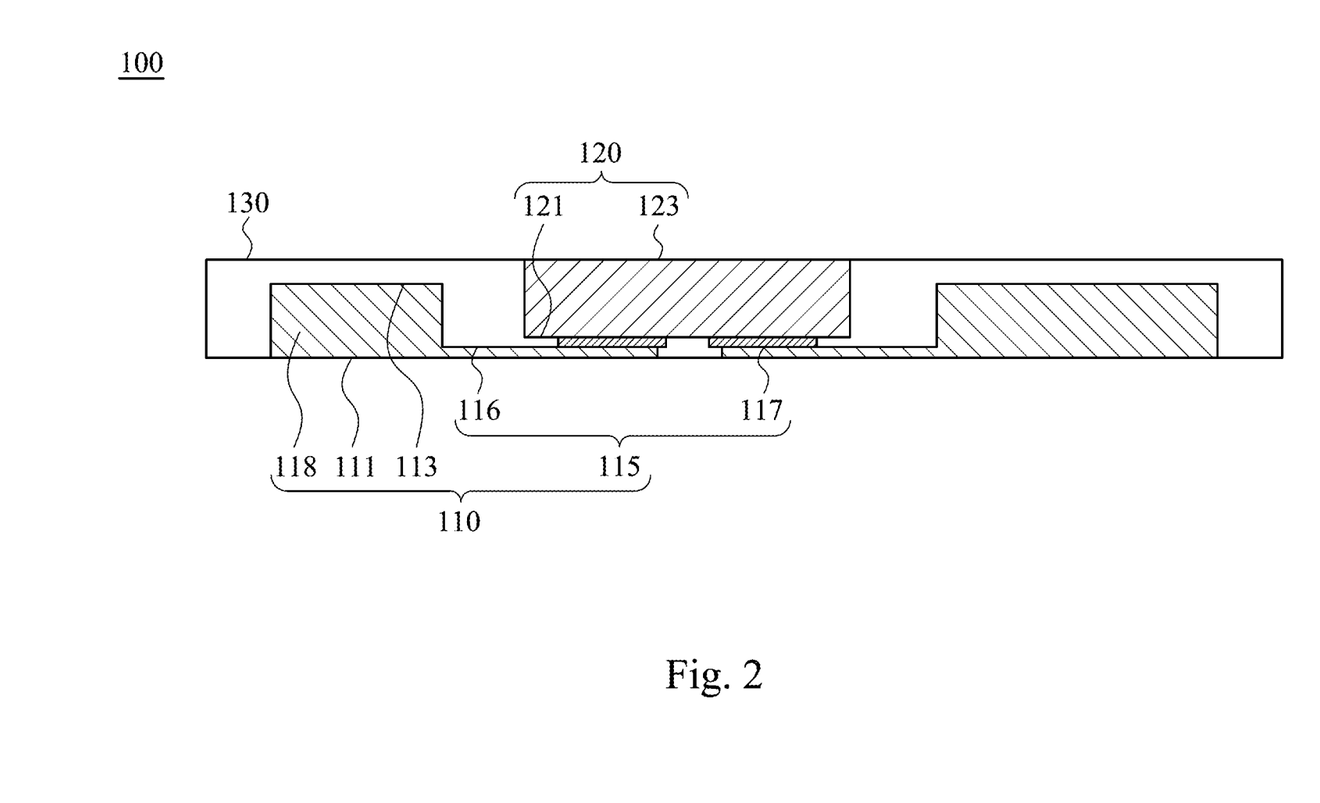
FIG. 2 is a cross-sectional view viewed along line 2-2 of FIG. 1.

FIG. 1 is a perspective view of a packaging structure according to one embodiment of this invention. FIG. 2 is a cross-sectional view viewed along line 2-2 of FIG. 1. As shown in FIG. 1 and FIG. 2, a packaging structure 100 is provided. The packaging structure 100 includes a lead frame 110, a first chip 120, and a packaging material 130.

The lead frame 110 has a first surface 111 and a second surface 113 opposite to the first surface 111, and has a first recessed region 115 located on the second surface 113. The first chip 120 has a first surface 121 and a second surface 123 opposite to the first surface 121. The first surface 121 of the first chip 120 is fixed on the first recessed region 115, and the first surface 121 of the first chip 120 is electrically connected to at least a part of the first recessed region 115. The packaging material 130 surrounds the lead frame 110 and the first chip 120. The second surface 123 of the first chip 120 is exposed from the packaging material 130, and the first surface 111 of the lead frame 110 is entirely exposed from the packaging material 130. In other words, the first surface 111 of the lead frame 110 is not covered by the packaging material 130.

Because the first surface 111 of the lead frame 110 is entirely exposed from the packaging material 130, the second surface 123 of the first chip 120 is exposed from the packaging material 130, and the first chip 120 is fixed on the first recessed region 115, the heat generated by the first chip 120 can be effectively dissipated through the first surface 111 of the lead frame 110 and/or the second surface 123 of the first chip 120. Therefore, the heat dissipating ability of the packaging structure 100 is effectively enhanced.

Specifically, the first surface 111 of the lead frame 110 is flat, i.e., the first surface 111 of the lead frame 110 is a flat surface. Since the first surface 111 of the lead frame 110 is a flat surface, the first surface 111 of the lead frame 110 can be entirely exposed from the packaging material 130 while the shape of the packaging structure 100 still has integrity, i.e., the shape of the packaging structure 100 is cuboid. Embodiments of this disclosure are not limited thereto. The person having ordinary skill in the art can make proper modifications to the lead frame 110 depending on the actual application or need.

The lead frame 110 has a flat region 118 relative to the first recessed region 115, and a thickness of the flat region 118 is greater than a thickness of the first recessed region 115. Specifically, in some embodiment, the first recessed region 115 is formed by etching the second surface 113 of the lead frame 110.

Specifically, the heat generated by the first chip 120 is dissipated through the first recessed region 115 of the lead frame 110, and then through the first surface 111 of the lead frame 110. Since the thickness of the first recessed region 115 is less than the thickness of the flat region 118, the heat generated by the first chip 120 becomes more easily to be dissipated through the first recessed region 115 than the flat region 118 of the lead frame 110.

At the same time, because the thickness of the flat region 118 is greater than the thickness of the first recessed region 115, the overall structure strength of the packaging structure 100 will be sufficiently enough. Specifically, the structure strength of the packaging structure 100 is mainly provided or achieved by the lead frame 110 and the first chip 120. Therefore, for the first recessed region 115, the structure strength of the packaging structure 100 is provided by the first chip 120 and the first recessed region 115 of the lead frame 110; while for the flat region 118, the structure strength of the packaging structure 100 is provided mainly by the flat region 118 of the lead frame 110. Since the total thickness of the first chip 120 and the first recessed region 115 and the thickness of the flat region 118 are both large enough, the overall structure strength of the packaging structure 100 for the first recessed region 115 and the flat region 118 will be sufficiently enough.

In some embodiment, a thickness of the first chip 120 substantially equals to the thickness of the flat region 118. In some embodiment, the thickness of the first chip 120 is greater than the thickness of the first recessed region 115.

The thickness of the flat region 118 may be in a range from about 100 μm to about 250 μm. The thickness of the first recessed region 115 may be in a range from about 50 μm to about 100 μm. The thickness of the first chip 120 may be in a range from about 100 μm to about 300 μm. The total thickness of the packaging structure 100 may be in a range from about 400 μm to 1,000 μm. Embodiments of this disclosure are not limited thereto. The person having ordinary skill in the art can make proper modifications to the thickness of the flat region 118, the thickness of the first recessed region 115, the thickness of the first chip 120, and the total thickness of the packaging structure 100 depending on the actual application or need.

The material of the substrate of the first chip 120 may be made of metal, such as copper. The material of the packaging material 130 may be made of molding compound. Embodiments of this disclosure are not limited thereto. The person having ordinary skill in the art can make proper modifications to the material of the substrate of the first chip 120 and/or the material of the packaging material 130 depending on the actual application or need.

Specifically, the first chip 120 is adapted to a "flip chip" processing. In other words, the first surface 121 of the first chip 120, which includes, for example, an active layer, is flipped over the first recessed region 115. The electrical connection between the first surface 121 of the first chip 120 and the first recessed region 115 of the lead frame 110 may be achieved by utilizing an area array of, for example, small solder bumps disposed on the first surface 121 of the first chip 120 (not shown in Figs.).

Figure 3:
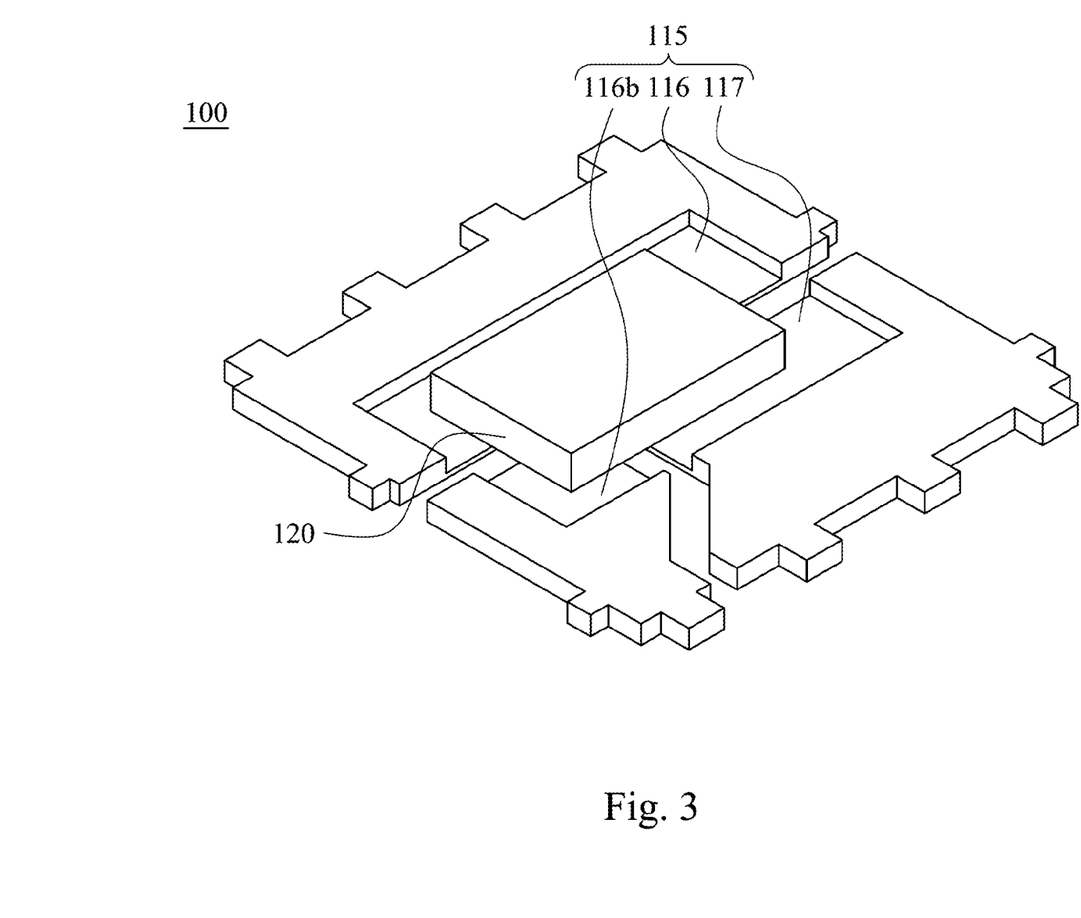
FIG. 3 is a perspective view of a packaging structure without a packaging material according to one embodiment of this invention.

FIG. 3 is a perspective view of a packaging structure without a packaging material according to one embodiment of this invention. As shown in FIG. 2 and FIG. 3, the first recessed region 115 is divided into a first segment 116 and a second segment 117. The first segment 116 is spatially isolated from the second segment 117, and the first surface 121 of the first chip 120 is electrically connected to both the first segment 116 and the second segment 117. Therefore, the first chip 120 can be electrically connected to different components by respectively electrically connecting the first segment 116 and the second segment 117 to different components.

The first recessed region 115 may be divided into more segments. For example, in this embodiment, the first recessed region 115 is further divided into the first segment 116, the second segment 117, and a third segment 116b. The third segment 116b is spatially isolated from both of the first segment 116 and the second segment 117.

Figure 4:
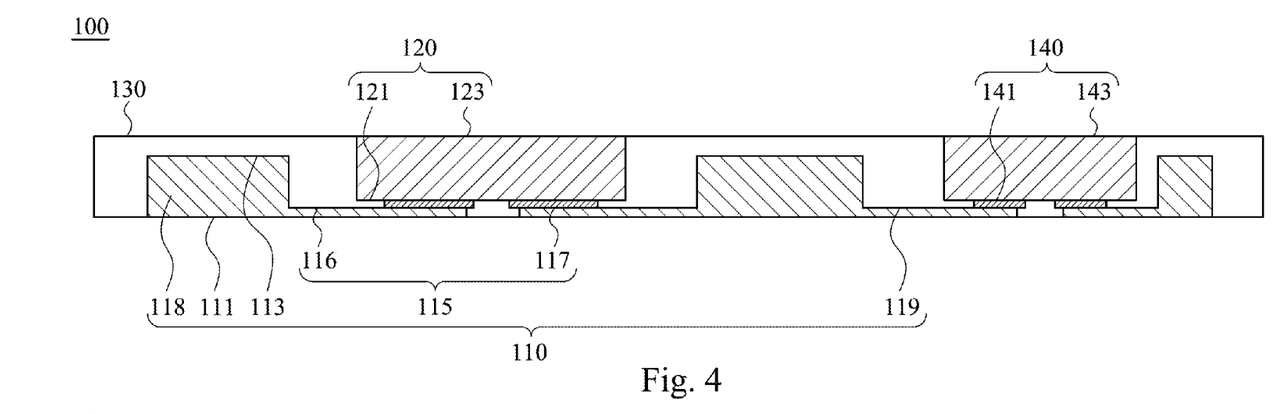
FIG. 4 is a cross-sectional view of the packaging structure according to another embodiment of this invention.

FIG. 4 is a cross-sectional view of the packaging structure according to another embodiment of this invention. As shown in FIG. 4, the packaging structure 100 of this embodiment is similar to the packaging structures 100 of FIG. 1, FIG. 2, and FIG. 3, and differences are described below.

The lead frame 110 of this embodiment further has a second recessed region 119 located on the second surface 113. The packaging structure 100 further includes a second chip 140 having a first surface 141 and a second surface 143 opposite to the first surface 141. The first surface 141 of the second chip 140 is fixed on the second recessed region 119 of the lead frame 110, and the first surface 141 of the second chip 140 is electrically connected to at least a part of the second recessed region 119. The packaging material 130 further surrounds the second chip 140, and the second surface 143 of the second chip 140 is exposed from the packaging material 130.

Specifically, the thicknesses of the first recessed region 115 and the second recessed 119 region are the same substantially.

Figure 5:
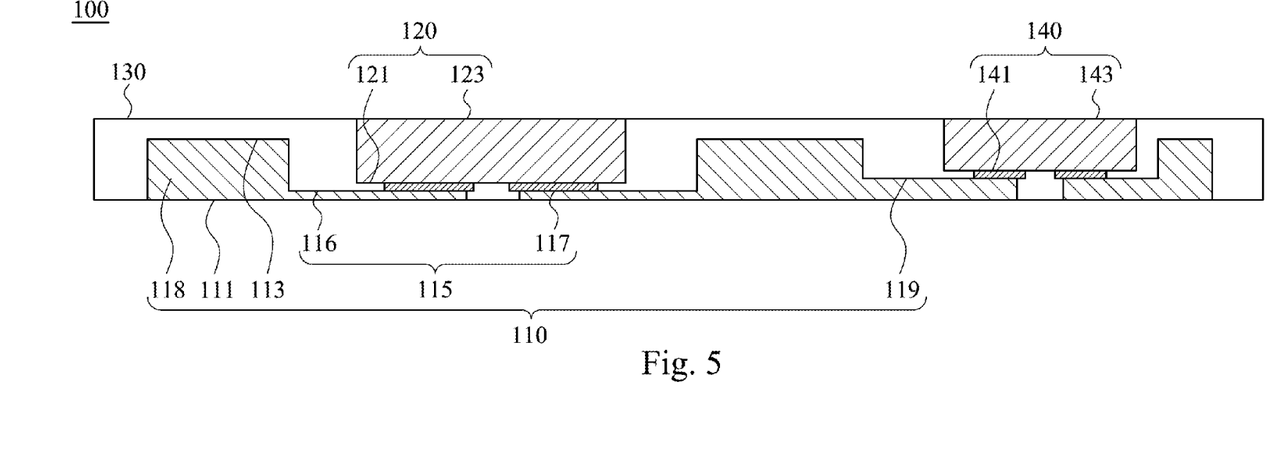
FIG. 5 is a cross-sectional view of the packaging structure according to another embodiment of this invention.

FIG. 5 is a cross-sectional view of the packaging structure according to another embodiment of this invention. As shown in FIG. 5, the packaging structure 100 of this embodiment is similar to the packaging structure 100 of FIG. 4, and the difference is that the thicknesses of the first recessed region 115 and the second recessed region 119 are different. In this embodiment, the thickness of the first recessed region 115 is smaller than the thickness of the second recessed region 119. Embodiments of this disclosure are not limited thereto. The person having ordinary skill in the art can make proper modifications to the thickness of the thicknesses of the first recessed region 115 and/or the thickness of the second recessed region 119 depending on the actual application or need.

Therefore, as shown in FIG. 4 and FIG. 5, the thicknesses of the first recessed region 115 and the second recessed region 119 can be adjusted according to the thicknesses of the first chip 120 and the second chip 140 respectively, such that the shape of the packaging structure 100 remains integrity. In addition, the packaging structure 100 may include further more chips and therefore the lead frame 110 may also have more recessed regions depending on the actual application or need.

Figure 6:
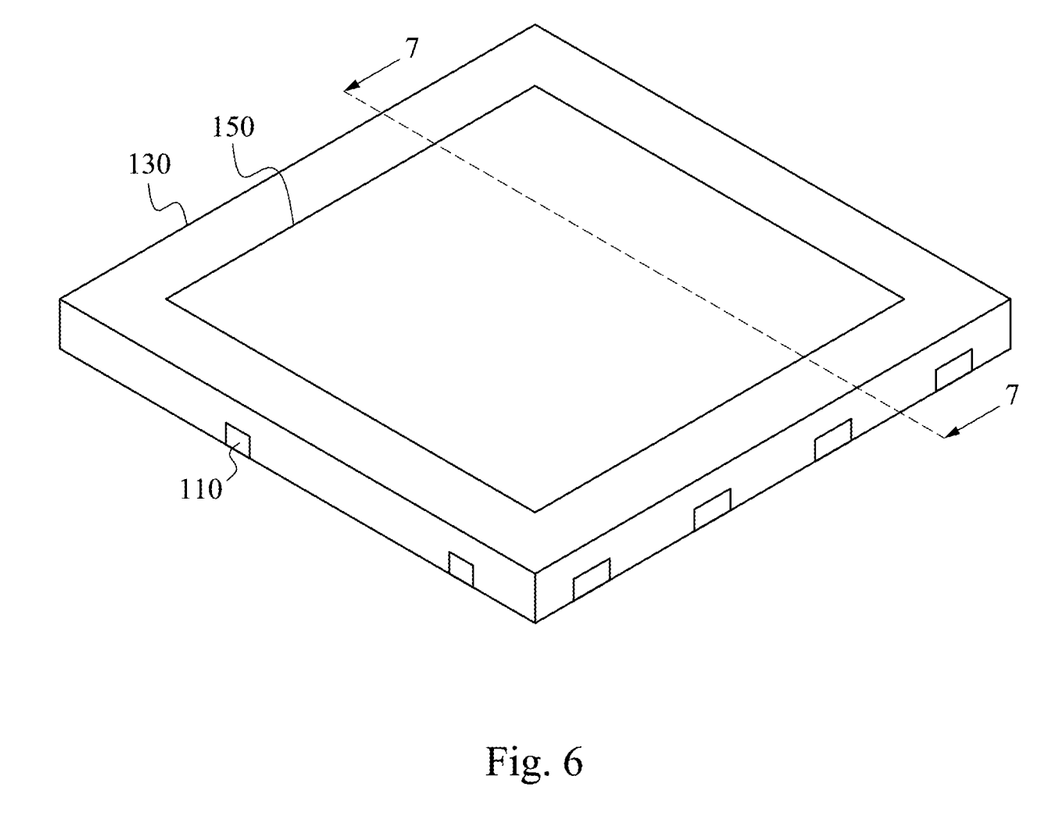
FIG. 6 is a perspective view of the packaging structure according to another embodiment of this invention.
Figure 7:
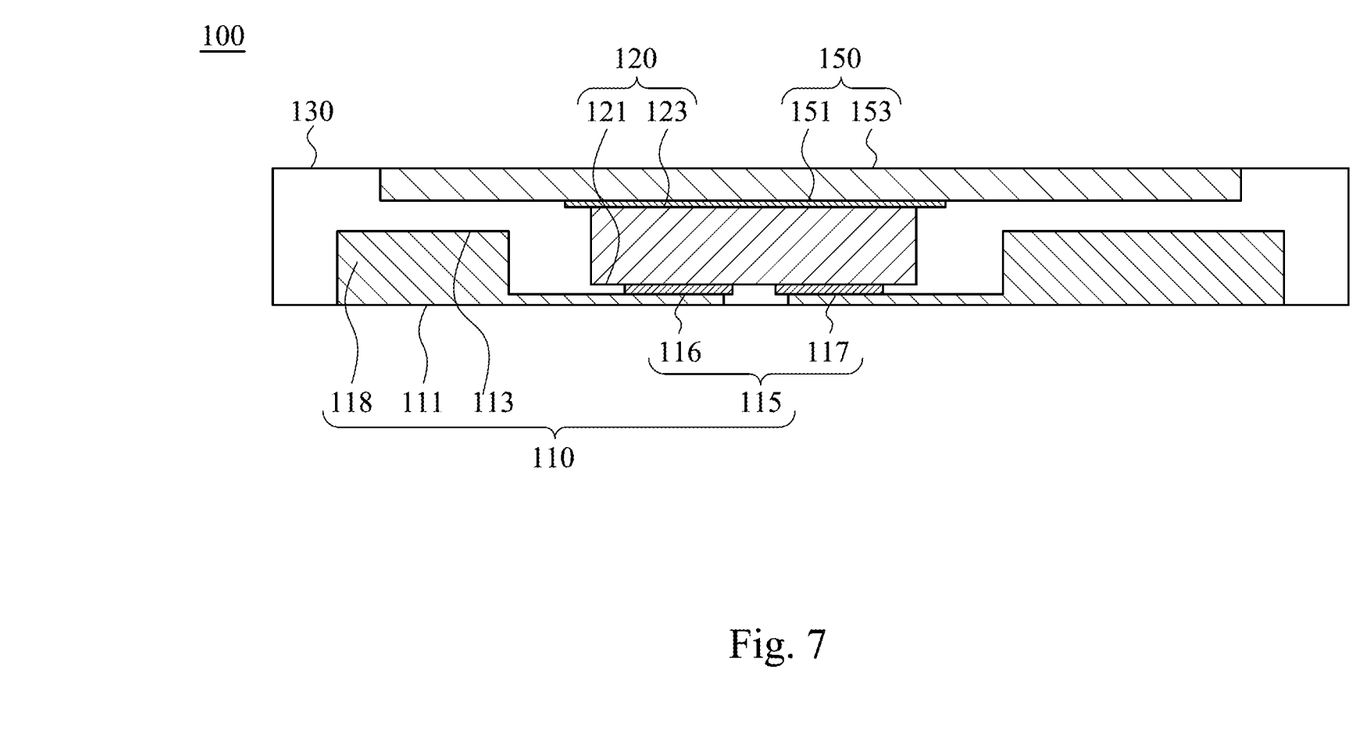
FIG. 7 is a cross-sectional view viewed along line 7-7 of FIG. 6.

FIG. 6 is a perspective view of the packaging structure according to another embodiment of this invention. FIG. 7 is a cross-sectional view viewed along line 7-7 of FIG. 6. As shown in FIG. 6 and FIG. 7, the packaging structure 100 of this embodiment is similar to the packaging structures 100 of FIG. 1, FIG. 2, and FIG. 3, and differences are described below.

The packaging structure 100 of this embodiment further includes a heat-dissipating member 150. The heat-dissipating member 150 has a first surface 151 and a second surface 153 opposite to the first surface 151. The first surface 151 of the heat-dissipating member 150 thermally contacts and covers the second surface 123 of the first chip 120. The packaging material 130 surrounds the lead frame 110, the first chip 120, and the heat-dissipating member 150. The second surface 153 of the heat-dissipating member 150 is exposed from the packaging material 130.

Specifically, a thickness of the heat-dissipating member 150 may be in a range from about 150 μm to about 250 μm. Embodiments of this disclosure are not limited thereto. The person having ordinary skill in the art can make proper modifications to the thickness of the heat-dissipating member 150 depending on the actual application or need.

Figure 8:
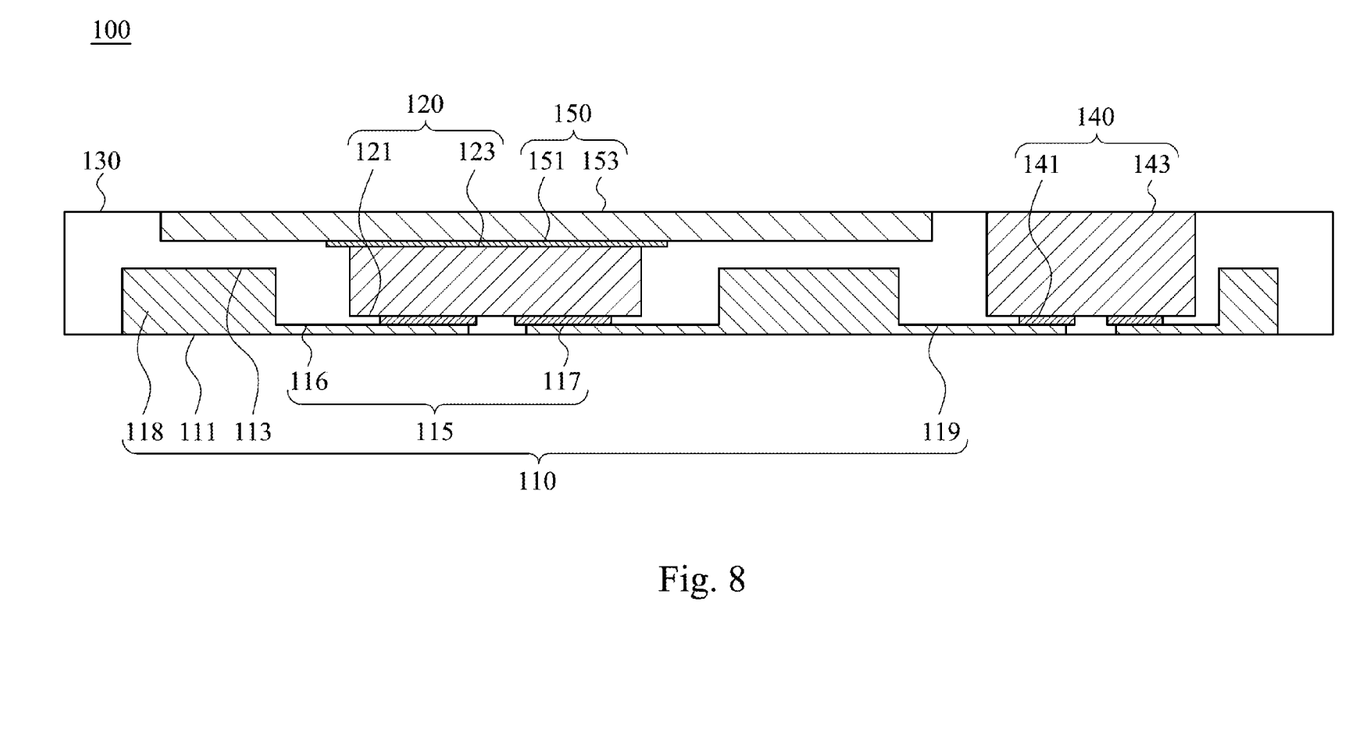
FIG. 8 is a cross-sectional view of the packaging structure according to another embodiment of this invention.

FIG. 8 is a cross-sectional view of the packaging structure according to another embodiment of this invention. As shown in FIG. 8, the packaging structure 100 of this embodiment is similar to the packaging structures 100 of FIG. 6 and FIG. 7, and differences are described below.

The lead frame 110 of this embodiment further has a second recessed region 119 located on the second surface 113. The packaging structure 100 further includes a second chip 140 having a first surface 141 and a second surface 143 opposite to the first surface 141. The first surface 141 of the second chip 140 is fixed on the second recessed region 119 of the lead frame 110, and the first surface 141 of the second chip 140 is electrically connected to at least a part of the second recessed region 119. The packaging material 130 further surrounds the second chip 140.

Specifically, the second surface 143 of the second chip 140 is exposed from the packaging material 130. Embodiments of this disclosure are not limited thereto. In other embodiments, the second surface 143 of the second chip 140 may not be exposed from the packaging material 130 (not shown in Figs.).

Specifically, the thicknesses of the first recessed region 115 and the second recessed region 119 are the same substantially.

Figure 9:
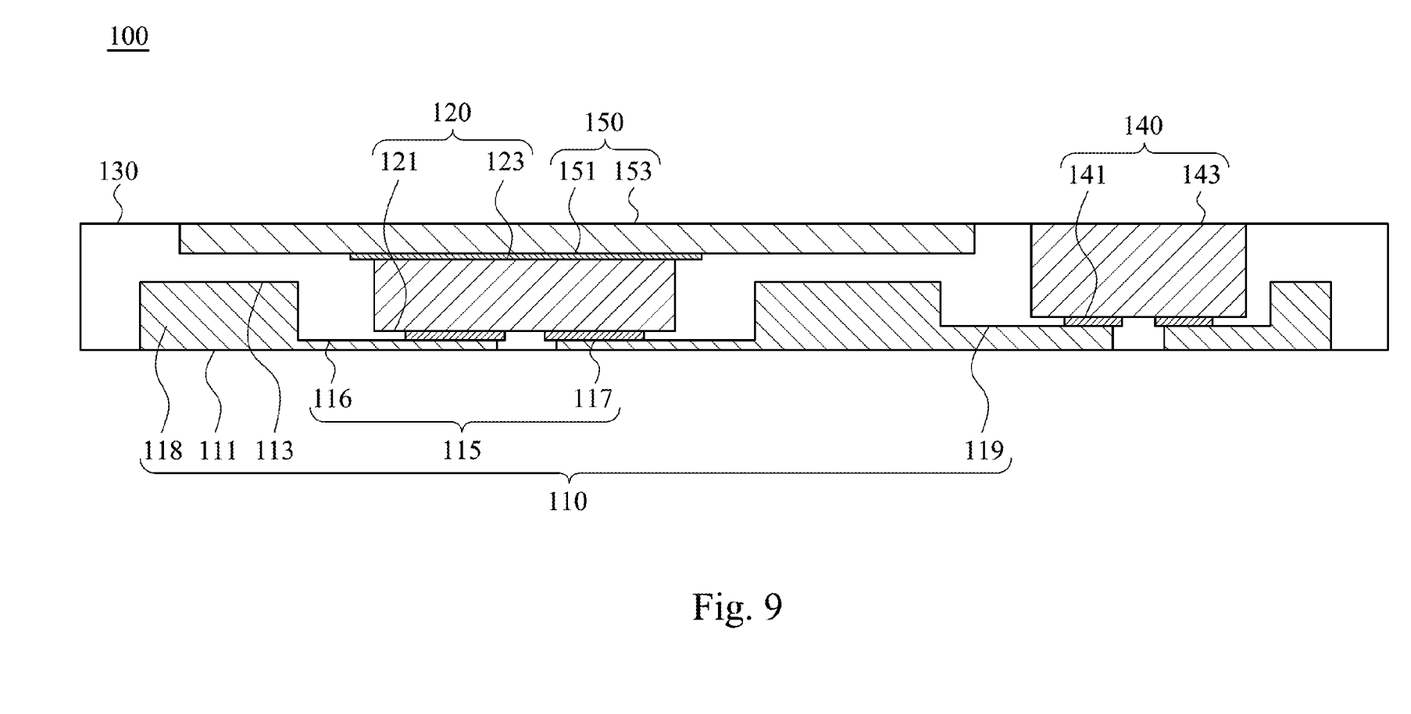
FIG. 9 is a cross-sectional view of the packaging structure according to another embodiment of this invention.

FIG. 9 is a cross-sectional view of the packaging structure according to another embodiment of this invention. As shown in FIG. 9, the packaging structure 100 of this embodiment is similar to the packaging structure 100 of FIG. 8, and the difference is that the thicknesses of the first recessed region 115 and the second recessed region 119 are different. In this embodiment, the thickness of the first recessed region 115 is smaller than the thickness of the second recessed region 119. Embodiments of this disclosure are not limited thereto. The person having ordinary skill in the art can make proper modifications to the thickness of the first recessed region 115 and/or the thickness of the second recessed region 119 depending on the actual application or need.

Because the first surface 111 of the lead frame 110 is entirely exposed from the packaging material 130 and the second surface 153 of the heat-dissipating member 150 is exposed from the packaging material 130, and the first surface 151 of the heat-dissipating member 150 thermally contacts and covers the second surface 123 of the first chip 120, the heat generated by the first chip 120 can be effectively dissipated through the first surface 111 of the lead frame 110 and the second surface 123 of the first chip 120, and then dissipated through the heat-dissipating member 150. Therefore, the heat dissipating ability of the packaging structure 100 is effectively enhanced.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for"

performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A packaging structure, comprising:
a lead frame having a pair of opposed first surface and second surface, and having a first recessed region located on the second surface;
a first chip having a pair of opposed first surface and second surface, wherein the first surface of the first chip is fixed on the first recessed region of the lead frame; and
a packaging material surrounding the lead frame and the first chip, wherein the second surface of the first chip is exposed from the packaging material, and the first surface of the lead frame is exposed from the packaging material.

2. The packaging structure of claim 1, wherein the first surface of the lead frame is not covered by the packaging material.

3. The packaging structure of claim 1, further comprises a second recessed region located on the second surface of the lead frame; and
a second chip having a pair of opposed first surface and second surface, wherein the first surface of the second chip is fixed on the second recessed region of the lead frame, the packaging material further surrounds the second chip, and the second surface of the second chip is exposed from the packaging material.

4. The packaging structure of claim 3, wherein thicknesses of the first recessed region of the lead frame and the second recessed region of the lead frame are the same substantially.

5. The packaging structure of claim 3, wherein thicknesses of the first recessed region of the lead frame and the second recessed region of the lead frame are different.

6. The packaging structure of claim 1, wherein the first recessed region of the lead frame is divided into a first segment and a second segment, the first segment is spatially isolated from the second segment, and the first surface of the first chip is electrically connected to the first segment and the second segment.

7. The packaging structure of claim 1, wherein the lead frame has a flat region relative to the first recessed region, and a thickness of the flat region is greater than a thickness of the first recessed region.

8. The packaging structure of claim 7, wherein a thickness of the first chip substantially equals to the thickness of the flat region of the lead frame.

9. The packaging structure of claim 1, wherein a thickness of the first chip is greater than a thickness of the first recessed region of the lead frame.

10. The packaging structure of claim 1, wherein the first surface of the lead frame is flat.

11. A packaging structure, comprising:
a lead frame having a pair of opposed first surface and second surface, and having a first recessed region located on the second surface;
a first chip having a pair of opposed first surface and second surface, wherein the first surface of the first chip is fixed on the first recessed region of the lead frame;
a heat-dissipating member having a pair of opposed first surface and second surface, wherein the first surface of the heat-dissipating member thermally contacts the second surface of the first chip; and
a packaging material surrounding the lead frame, the first chip, and the heat-dissipating member, wherein the second surface of the heat-dissipating member is exposed from the packaging material, and the first surface of the lead frame is exposed from the packaging material.

12. The packaging structure of claim 11, wherein the first surface of the lead frame is not covered by the packaging material.

13. The packaging structure of claim 11, further comprises:
a second recessed region located on the second surface of the lead frame; and
a second chip having a pair of opposed first surface and second surface, wherein the first surface of the second chip is fixed on the second recessed region of the lead frame, and the packaging material further surrounds the second chip.

14. The packaging structure of claim 13, wherein thicknesses of the first recessed region of the lead frame and the second recessed region of the lead frame are the same substantially.

15. The packaging structure of claim 13, wherein thicknesses of the first recessed region of the lead frame and the second recessed region of the lead frame are different.

16. The packaging structure of claim 11, wherein the first recessed region of the lead frame is divided into a first segment and a second segment, the first segment is spatially isolated from the second segment, and the first surface of the first chip is electrically connected to the first segment and the second segment.

17. The packaging structure of claim 11, wherein the lead frame has a flat region relative to the first recessed region, and a thickness of the flat region is greater than a thickness of the first recessed region.

18. The packaging structure of claim 17, wherein a thickness of the first chip substantially equals to the thickness of the flat region of the lead frame.

19. The packaging structure of claim 11, wherein a thickness of the first chip is greater than the thickness of the first recessed region of the lead frame.

20. The packaging structure of claim 11, wherein the first surface of the lead frame is flat.

* * * * *